United States Patent
Oota et al.

(10) Patent No.: US 9,243,129 B2
(45) Date of Patent: Jan. 26, 2016

(54) PROCESS FOR PRODUCING RESIN COMPOSITION FOR OPTICAL SEMICONDUCTOR

(71) Applicant: NITTO DENKO CORPORATION, Osaka (JP)

(72) Inventors: Takamitsu Oota, Osaka (JP); Takahiro Uchida, Osaka (JP); Tomohiro Fukuda, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 155 days.

(21) Appl. No.: 14/138,763

(22) Filed: Dec. 23, 2013

(65) Prior Publication Data
US 2014/0187671 A1 Jul. 3, 2014

(30) Foreign Application Priority Data

Dec. 27, 2012 (JP) .................................. 2012-285791
Nov. 21, 2013 (JP) .................................. 2013-241235

(51) Int. Cl.
| C08K 7/18 | (2006.01) |
| C08K 3/22 | (2006.01) |
| C08K 5/05 | (2006.01) |
| B29B 7/00 | (2006.01) |
| C08J 3/20 | (2006.01) |
| B29B 7/40 | (2006.01) |
| B29B 7/46 | (2006.01) |
| B29B 7/74 | (2006.01) |
| B29B 7/82 | (2006.01) |

(52) U.S. Cl.
CPC . *C08K 7/18* (2013.01); *B29B 7/007* (2013.01); *B29B 7/40* (2013.01); *B29B 7/46* (2013.01); *C08J 3/203* (2013.01); *C08K 3/22* (2013.01); *C08K 5/05* (2013.01); *B29B 7/7466* (2013.01); *B29B 7/7485* (2013.01); *B29B 7/82* (2013.01); *C08K 2003/2241* (2013.01)

(58) Field of Classification Search
CPC ............ B29B 7/007; B29B 7/30; B29B 7/34; B29B 7/38; B29B 7/82; B29B 7/83; B29B 7/7485; B29B 7/749; B29B 9/10
See application file for complete search history.

(56) References Cited

U.S. PATENT DOCUMENTS 5,789,493 A * 8/1998 Van Aaken ............... C08J 3/203
523/439

FOREIGN PATENT DOCUMENTS

JP 2002-121261 A 4/2002

* cited by examiner

*Primary Examiner* — Mark Kaucher
*Assistant Examiner* — Kregg Brooks
(74) *Attorney, Agent, or Firm* — Sughrue Mion, PLLC

(57) ABSTRACT

The present invention relates to a process for producing a resin composition for an optical semiconductor from a powdery material and a liquid material using a kneader having a first supply port and a secondary supply port disposed at a downstream side of the first supply port, the process including: a step of supplying the powdery material into the kneader from the first supply port and delivering the powdery material to a second supply port side by the kneader at a temperature at which the powdery material is not melted; a step of melting the powdery material by heating and simultaneously supplying the liquid material from the second supply port under a pressure higher than a pressure in the kneader to knead a melted product of the powdery material and the liquid material; and a step of further kneading a kneaded product thereof while cooling.

3 Claims, 1 Drawing Sheet

PROCESS FOR PRODUCING RESIN COMPOSITION FOR OPTICAL SEMICONDUCTOR

FIELD OF THE INVENTION

The present invention relates to a process for producing a resin composition for use in encapsulation of an optical semiconductor such as a light-emitting diode or in a reflector.

BACKGROUND OF THE INVENTION

As resin compositions for encapsulation of optical semiconductors such as a light-emitting diode or for reflectors, epoxy resin compositions have been employed. As processes for producing the epoxy resin compositions, a process for continuously producing them at a good production efficiency has been proposed (for example, see Patent Document 1). The process uses a kneading apparatus shown in FIG. 2. Namely, in the kneading apparatus, a first kneader $N_1$ having a heating unit $H_1$ and a second kneader $N_2$ having a cooling unit $C_1$ are sequentially connected in series, supply ports 11 and 12 are formed at upstream parts of individual kneaders $N_1$ and $N_2$, and a discharge port 13 is formed at a downstream part of the second kneader $N_2$. A mixture of a powdery epoxy resin and a liquid curing agent mixed previously is supplied from the supply port 11 of the first kneader $N_1$ and the mixture is kneaded with a kneading screw $S_1$ of the first kneader $N_1$ while heating by a heating unit $H_1$. By the kneading while heating, the mixture is homogeneously kneaded. Then, a kneaded product thereof is delivered to the second kneader $N_2$. Subsequently, a powdery curing accelerator is supplied from the supply port 12 of the second kneader $N_2$ and the kneaded product and the curing accelerator are kneaded by a kneading screw $S_2$ of the second kneader $N_2$ while cooling by a cooling unit $C_1$. By the kneading while cooling, the curing accelerator is kneaded sufficiently and homogeneously with the kneaded product with suppressing the reaction of the epoxy resin with the liquid curing agent. Subsequently, the resulting kneaded product (epoxy resin composition) is discharged from the discharge port 13.
Patent Document 1: JP-A-2002-121261

SUMMARY OF THE INVENTION

In the conventional process for producing epoxy resin compositions, the powdery epoxy resin and the liquid curing agent are previously mixed prior to the supply to the supply port 11 of the first kneader $N_1$. The reason thereof is that, when the powdery material (epoxy resin) and the liquid material (curing agent) are simply kneaded in a kneader, since the both cannot be homogeneously dispersed, an uneven reaction and content deviation occur, and thus the quality is not stabilized. Furthermore, the mixing of the powdery epoxy resin and the liquid curing agent prior to the supply to the supply port 11 of the first kneader $N_1$ is performed batch-wise in which the mixing is performed for every predetermined amount using a mixing tank or the like Namely, in the conventional process for producing epoxy resin compositions, although continuous production is possible after the supply of the mixture of the powdery epoxy resin and the liquid curing agent mixed previously to the supply port 11 of the first kneader $N_1$, continuous production is not achieved when the step of mixing the powdery epoxy resin and the liquid curing agent before the supply is included. When continuous kneading is tried for achieving the continuous production, the quality of the epoxy resin composition to be produced cannot be stabilized as mentioned above.

The present invention is devised in consideration of such circumstances and an object thereof is to provide a process for producing a resin composition for an optical semiconductor, the process being capable of homogeneously kneading a powdery material and a liquid material using a kneader and being capable of stabilizing the quality of the resin composition for an optical semiconductor even when the resin composition for an optical semiconductor is produced by continuous kneading.

In order to attain the object above, the present invention relates to the following items (1) to (3).

(1) A process for producing a resin composition for an optical semiconductor from a powdery material and a liquid material using a kneader having a first supply port and a secondary supply port disposed at a downstream side of the first supply port, the process including:

a step of supplying the powdery material into the kneader from the first supply port and delivering the powdery material to a second supply port side by the kneader at a temperature at which the powdery material is not melted;

a step of melting the powdery material by heating and simultaneously supplying the liquid material from the second supply port under a pressure higher than a pressure in the kneader to knead a melted product of the powdery material and the liquid material; and a step of further kneading a kneaded product thereof while cooling.

(2) The process for producing a resin composition for an optical semiconductor according to (1), in which the liquid material is a curing agent and the powdery material is an epoxy resin, a filler, an antioxidant, and a curing accelerator.

(3) The process for producing a resin composition for an optical semiconductor according to (2), in which the temperature at which the powdery material is not melted is set within a range of 5 to 50° C., a heating temperature for melting the powdery material is set within a range of 100 to 170° C., and a temperature for cooling the kneaded product is set within a range of 20 to 85° C.

For achieving the intended object, the present inventors have extensively studied a method for supplying a powdery material and a liquid material necessary for the production of the resin composition for an optical semiconductor to a kneader, using a kneader having a first supply port and a second supply port disposed at a downstream side of the first supply port. As a result, they have found out that the object is achieved by performing the following first to third steps. Namely, as the first step, the powdery material is supplied into the kneader from the first supply port and the powdery material is delivered to the second supply port side by the kneader at a temperature at which the powdery material is not melted. Thereafter, as the second step, the powdery material is melted by heating and simultaneously the liquid material is supplied from the second supply port under a pressure higher than the pressure in the kneader to knead a melted product of the powdery material and the liquid material. Subsequently, as the third step, a kneaded product thereof is further kneaded while cooling. Thus, they have found that, when such first to third steps are performed, it becomes possible to knead the powdery material and the liquid material homogeneously by the kneader and the quality of the resin composition for an optical semiconductor to be produced is stabilized even when continuous kneading is conducted, so that they have accomplished the invention.

Incidentally, the "resin composition for an optical semiconductor" in the invention is a resin composition for use in encapsulation of an optical semiconductor such as a light-emitting diode or in a reflector, and a black encapsulating material containing a black dye or a black pigment for use in transfer molding is not included in the invention.

In the process for producing a resin composition for an optical semiconductor of the invention, using a kneader having a first supply port and a second supply port disposed at a downstream side of the first supply port, first, in the first step, a powdery material supplied into the kneader from the first supply port is delivered to the second supply port side by the kneader in such a manner that the powdery material is not melted. Therefore, the powdery material can be homogeneously dispersed and, at a terminal end of the kneader, the produced resin composition for an optical semiconductor can be easily discharged quantitatively. Even in the case where two or more powdery materials are supplied from the first supply port, they can be sufficiently and homogeneously mixed until they are delivered to the second supply port side. Then, in the second step, the powdery material is melted by heating at the part of the second supply port. Therefore, a melted product of the powdery material becomes easily compatible with a liquid material to be supplied under a high pressure from the second supply port in the second step and the both can be homogeneously kneaded by the kneader. Then, in the third step, a kneaded product thereof is further kneaded but, since the kneading is performed while cooling, the reaction of the kneaded product itself can be suppressed and the resin composition for an optical semiconductor can be obtained in that state. Thus, since the process includes the above first to third steps, a powdery material and a liquid material can be homogeneously kneaded by the kneader. Accordingly, the combination of the first to third steps can stabilize the quality of the resin composition for an optical semiconductor to be produced even when continuous kneading is performed as mentioned above.

Particularly, in the case where the liquid material is a curing agent and the powdery material is an epoxy resin, a filler, an antioxidant, and a curing accelerator, an epoxy resin composition having a stable quality can be produced as the resin composition for an optical semiconductor.

Furthermore, in the case where the temperature at which the powdery material is not melted is set within the range of 5 to 50° C., the heating temperature for melting the powdery material is set within the range of 100 to 170° C., and the temperature for cooling the kneaded product is set within the range of 20 to 85° C., an epoxy resin composition having a more stable quality can be obtained.

DETAILED DESCRIPTION OF THE INVENTION

The following will describe embodiments of the invention in detail with reference to drawings.

Figure 1:
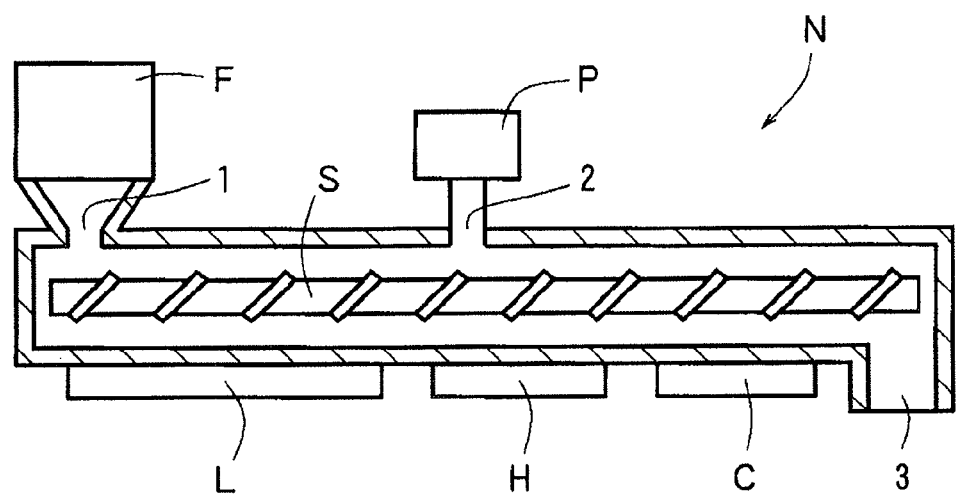
FIG. 1 is an explanatory drawing schematically showing a kneader for use in one embodiment of the process for producing a resin composition for an optical semiconductor of the invention.

FIG. 1 is an explanatory drawing schematically showing a kneader for use in one embodiment of the process for producing a resin composition for an optical semiconductor of the invention. The kneader N of the embodiment has a kneading screw S having parallel two axes (in FIG. 1, only one axis is shown since two axes are overlapped each other), a first supply port 1 is formed at an upstream part (left part in FIG. 1), a second supply port 2 is formed at a midstream part (central part in FIG. 1), and a discharge port 3 is formed at a downstream part (right part in FIG. 1). This embodiment has a specific constitution as follows. Namely, the first supply port 1 is a port for supplying a powdery material and a powder-supplying unit F is connected to the first supply port 1. The second supply port 2 is a port for supplying a liquid material under a pressure higher than the pressure in the kneader N and a pressurization injection unit P is connected to the second supply port 2. Furthermore, between the first supply port 1 and the second supply port 2, a low-temperature maintenance unit L is provided so that the powdery material that moves therebetween is not melted through heating to high temperature. Between the second supply port 2 and a predetermined downstream part, a heating unit H is provided for melting the powdery material delivered to the part of the second supply port 2. Between the heating unit H and the discharge port 3, a cooling unit C is provided for cooling a kneaded product that has been kneaded while heating at an upstream side.

For more detailed explanation, as the powder-supplying unit F, for example, a powder-supplying device generally employed in a kneader or the like is used.

As the pressurization injection unit P, for example, a pressurization injection pump or the like is used.

As the low-temperature maintenance unit L, for example, a water jacket-type cooling circulating apparatus or the like is used.

As the heating unit H, for example, an electric heater or the like is used.

As the cooling unit C, for example, a water jacket-type cooling circulating apparatus or the like is used.

In the embodiment, an epoxy resin composition is produced as the resin composition for an optical semiconductor using the above kneader, as follows.

First, as the powdery material, an epoxy resin, a filler, an antioxidant, and a curing accelerator are prepared and are set in the powder-supplying unit F. In addition, as the liquid material, a curing agent is prepared and is set in the pressurization injection unit P.

Then, a predetermined certain amount of the powdery material is continuously supplied from the powder-supplying unit F into the kneader N through the first supply port 1 and is delivered to the second supply port 2 side by the kneading screw S of the kneader N while mixing. Since the low-temperature maintenance unit L is provided between the first supply port 1 and the second supply port 2, the powdery material is not melted and maintains the powdery form. Thereby, a plurality of the powdery materials such as the epoxy resin and the filler are homogeneously mixed and are homogeneously dispersed without forming any lump. Incidentally, from the viewpoint of preventing the generation of deviation of compositional ratio such as content deviation, the accuracy of supplied amount of the powdery material from the powder-supplying unit F preferably falls within 3% of a set value. Moreover, from the viewpoint of not melting the powdery material, the temperature set by the low-temperature maintenance unit L preferably falls within the range of 5 to 50° C.

Subsequently, the powdery material delivered to the part of the second supply port 2 is melted by the heating unit H. Simultaneously, a predetermined certain amount of the liquid material (curing agent) is continuously supplied from the pressurization injection unit P into the kneader N through the second supply port 2. The supply pressure at this time is set higher than the pressure in the kneader N. For example, the pressure is 0.05 to 1.5 MPa, preferably 0.1 to 1.3 MPa, and more preferably 0.15 to 1.0 MPa. A melted product of the powdery material and the liquid material are kneaded by the kneading screw S of the kneader N. In this step, since the powdery material is melted, the material becomes easily compatible with the liquid material that has been supplied under the high pressure and the both can be homogeneously kneaded. Incidentally, from the viewpoint of preventing the generation of deviation of compositional ratio such as content deviation, the accuracy of supplied amount of the liquid material from the pressurization injection unit P preferably falls within 1.5% of a set value. Moreover, from the viewpoint of melting the powdery material, the temperature set by the heating unit H preferably falls within the range of 100 to 170° C.

Thereafter, a kneaded product of the melted product of the powdery material and the liquid material is further kneaded by the kneading screw S of the kneader N while cooling by the cooling unit C to produce an epoxy resin composition and it is continuously discharged from the discharge port 3. The cooling by the cooling unit C is performed for suppressing the reaction of the kneaded product itself and, from this viewpoint, the cooling temperature to be set preferably falls within the range of 20 to 85° C. Moreover, since the powdery material is homogeneously dispersed without forming any lump in the step from the first supply port 1 to the second supply port 2, the amount of the epoxy resin composition to be discharged from the discharge port 3 is almost constant. By the continuous kneading as mentioned above, an epoxy resin composition having a stable quality can be obtained.

Here, the powdery materials (epoxy resin, a filler, an antioxidant, and a curing accelerator) and the liquid material (curing agent) will be described in detail.

Examples of the epoxy resin include bisphenol A-type epoxy resins, bisphenol F-type epoxy resins, novolak-type epoxy resins such as phenol novolak-type epoxy resins and cresol novolak-type epoxy resins, alicyclic epoxy resins, triglycidyl isocyanurate, nitrogen-containing ring epoxy resins such as hydantoin-type epoxy resins, hydrogenated bisphenol A-type epoxy resins, aliphatic epoxy resins, glycidyl ether-type epoxy resins, bisphenol S-type epoxy resins, biphenyl-type epoxy resins that are the mainstream of cured body-type ones exhibiting low water absorption, dicyclo ring-type epoxy resins, and naphthalene-type epoxy resins. They can be used singly or two or more thereof can be used in combination. Of these epoxy resins, from the viewpoint of excellence in transparency and discoloration resistance, it is preferable to use alicyclic epoxy resins and triglycidyl isocyanurate singly or in combination.

Moreover, the average epoxy equivalent of the epoxy resin is preferably from 90 to 1,000. When the epoxy equivalent is too small, a cured body of the resin composition becomes brittle in some cases and, when the epoxy equivalent is too large, glass transition temperature (Tg) of the cured body of the resin composition tends to lower.

Examples of the filler include titanium oxide, zinc oxide, white lead, kaolin, calcium carbonate, zirconium oxide, quartz glass powder, talc, silica powder such as fused silica powder and crystalline silica powder, alumina powder, aluminum nitride powder, and silicon nitride powder. They may be used singly or two or more thereof may be used in combination. Of these, from the viewpoints of excellent whiteness, large light reflectance and masking strength and tinting strength, high dispersibility, excellent weather resistance, extremely excellent chemical stability, and the like, it is preferable to use titanium oxide. Of these, from the viewpoints of flowability and light-shielding ability, it is preferable to use a filler having an average particle diameter of 0.05 to 1.0 μm. Particularly preferred is 0.08 to 0.5 μm from the viewpoint of light reflectance. Moreover, from the viewpoint of reducing a linear expansion coefficient, it is preferable to use silica powder and, particularly from the viewpoints of high filling ability and high flowability, it is preferable to use spherical fused silica powder. Of these, it is preferable to use a filler having an average particle diameter in the range of 5 to 60 μm particularly preferably in the range of 15 to 45 μm. The average particle diameter can be measured, for example, using a laser diffraction/scattering particle size distribution analyzer.

Examples of the antioxidant include antioxidants such as phenolic compounds, amine-based compounds, organic sulfur-based compounds, and phosphine-based compounds. Also, a modifier (for example, glycols, silicones, alcohols and the like) and a defoaming agent (for example, silicone-based ones and the like) may be used according to the necessity.

Examples of the curing accelerator include tertiary amines such as 1,8-diaza-bicyclo[5.4.0]undecene-7, triethylenediamine, and tri-2,4,6-dimethylaminomethylphenol; imidazoles such as 2-ethyl-4-methylimidazole and 2-methylimidazole; phosphorus compounds such as triphenylphosphine, tetraphenylphosphonium tetraphenylborate, methyltributylphosphonium dimethylphosphate, and tetra-n-butylphosphonium-o,o-diethylphosphorodithioate; quaternary ammonium salts; organic metal salts; and derivatives thereof. They may be used singly or two or more thereof may be used in combination. Of these curing agents, it is preferable to use tertiary amines, imidazoles, and phosphorus compounds. Of these, in order to obtain a transparent and tough cured body having a small degree of coloration, it is particularly preferable to use phosphorus compounds.

The content of the curing accelerator is preferably set at 0.01 to 8.0% by weight, more preferably 0.1 to 3.0% by weight relative to the epoxy resin. Namely, when the content of the curing accelerator is too small, a sufficient curing accelerating effect is not obtained in some cases and, when the content of the curing accelerator is too large, the resulting cured body tends to be colored.

As the curing agent, acid anhydride-based liquid ones are used and examples thereof include methyltetrahydrophthalic anhydride, methyl-end-methylenetetrahydrophthalic anhydride, methylbutenyltetrahydrophthalic anhydride, dodecenylsuccinic anhydride, and methylhexahydrophthalic anhydride. They may be used singly or two or more thereof may be used in combination. Incidentally, it is sufficient that the agent is finally in a liquid form and hence an agent obtained by dissolving solid one in liquid one may be used.

Figure 2:
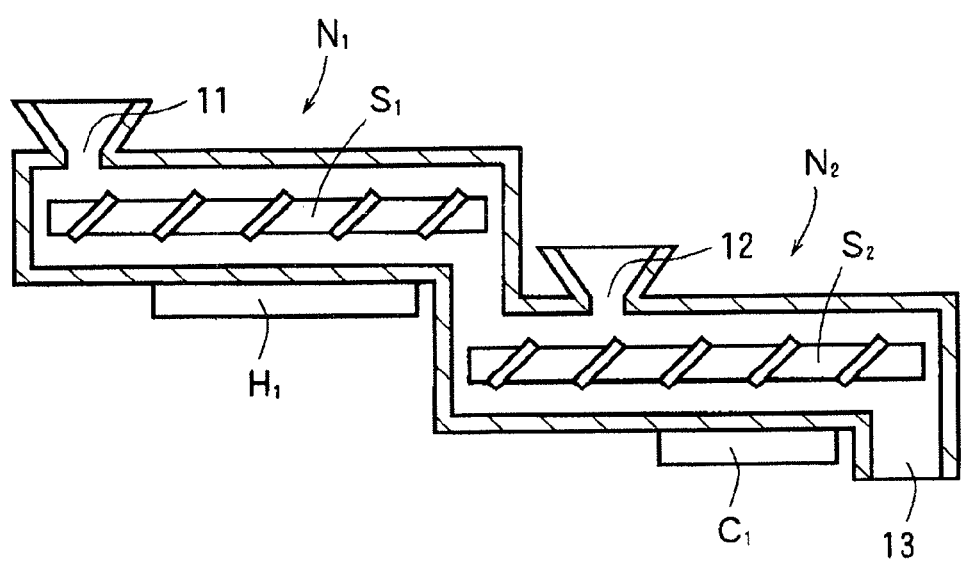
FIG. 2 is an explanatory drawing schematically showing a kneader for use in a conventional process for producing a resin composition for an optical semiconductor.

In the above embodiment, one pair of the kneading screws S as shown in FIG. 1 is used as the kneader N but two pairs of the kneading screws $S_1$ and $S_2$ arranged in series may be used as shown in FIG. 2 as long as continuous kneading is possible. Moreover, in the above embodiment, the kneading screw S has two axes but may have one axis or three axes.

Furthermore, in the embodiment, an epoxy resin composition is produced as the resin composition for an optical semiconductor but it may be the other resin composition.

The following will describe Examples together with Comparative Examples. However, the invention should not be construed as being limited to Examples.

EXAMPLES

As a powdery epoxy resin, 1,000 g of triglycidyl isocyanurate and 50 g of (3,4-epoxycyclohexyl)methyl-3,4-epoxycyclohexylcarboxylate were prepared.

As a powdery filler, 4,000 g of titanium oxide (rutile type, average particle diameter: 0.21 μm) and 15,000 g of silica (spherical fused one, average particle diameter: 23 μm) were prepared.

As a powdery antioxidant, 15 g of butylhydroxytoluene was prepared.

As a powdery curing accelerator, 10 g of tetra-n-butylphosphonium-o,o-diethylphosphorodithioate was prepared.

As a liquid curing agent, 1,320 g of RIKACID MH-700 manufactured by New Japan Chemical Co., Ltd. [70% (4-methylhexahydrophthalic anhydride)+30% (hexahydrophthalic anhydride)] was prepared.

Example

Using a kneader shown in FIG. 1, an epoxy resin composition was produced from the above powdery materials and the liquid material in the same manner as in the above embodiment. On this occasion, the set temperature by a low-temperature maintenance unit was 25° C., the set temperature by a heating unit was 150° C., and the set temperature by a cooling unit was 80° C. Moreover, the supply amount of the powdery materials from a powder-supplying unit was set at 25 kg per hour (accuracy: ±3.0%). Furthermore, the supply amount of the liquid material from a pressurization injection unit was set at 1,678 g per hour (accuracy: ±1.5%) and the injection pressure was set at 0.2 MPa (accuracy: 0.1 to 0.5 MPa).

Comparative Example 1

In the above Example, the supply port of the liquid material was moved to an upstream position that was equal to the position of the first supply port. The other conditions were the same as in the above Example.

Comparative Example 2

In the above Example, the supply port of the liquid material was moved to an upstream position between the first supply port and the second supply port. The other conditions were the same as in the above Example.

Comparative Example 3

In the above Example, the supply port of the liquid material was moved to a downstream position corresponding to the cooling unit. The other conditions were the same as in the above Example.

Comparative Example 4

In the above Example, the liquid material was supplied from the second supply port without pressurization. The other conditions were the same as in the above Example.

Comparative Example 5

In the above Comparative Example 1, the liquid material was supplied without pressurization. The other conditions were the same as in the above Comparative Example 1.

[Inspection of State of Epoxy Resin Compositions]

The state of the epoxy resin compositions produced in the above Example and Comparative Examples 1 to 5 were visually inspected. As a result, in Example, high quality one without content deviation was obtained. On the other hand, in Comparative Example 1, since the supply port of the liquid material was present at an upstream position that was equal to the position of the first supply port, the pressure of the liquid material supplied under pressure escaped from the first supply port and hence sufficient kneading was impossible. In Comparative Example 2, since the liquid material was supplied in such a state that the powdery materials were not melted, the composition was obtained in a slurry form. In Comparative Example 3, since the liquid material was supplied in such a state that the melted product of the powdery materials were cooled, they could not be mixed sufficiently and homogeneously. In Comparative Example 4, since the liquid material was supplied without pressurization, the liquid material flowed backward by the action of the pressure in the kneader, so that the melted product of the powdery materials and the liquid material could not be kneaded. In Comparative Example 5, since the supply port of the liquid material was present at an upstream position that was equal to the position of the first supply port, the liquid material was not sufficiently mixed with the powdery materials and remained in the kneader, so that content deviation occurred.

From the above results, it is revealed that, when the powdery materials and the liquid material are supplied into the kneader in the manner as in Example, the resulting epoxy resin composition has a high quality even if continuous kneading is performed.

The present application is based on Japanese Patent Applications No. 2012-285791 filed on Dec. 27, 2012 and No. 2013-241235 filed on Nov. 21, 2013, and the contents are incorporated herein by reference.

The process for producing a resin composition for an optical semiconductor of the invention can be utilized in the case where a powdery material and a liquid material are continuously kneaded to produce a resin composition for an optical semiconductor using a kneader having a first supply port and a secondary supply port at a downstream side of the first supply port.

DESCRIPTION OF REFERENCE NUMERALS AND SIGNS

N: Kneader
F: Powder-supplying unit
P: Pressurization injection unit
L: Low-temperature maintenance unit
H: Heating unit
C: Cooling unit
1: First supply port
2: Second supply port

What is claimed is:

1. A process for producing a resin composition for an optical semiconductor from a powdery material and a liquid material using a kneader having a first supply port and a secondary supply port disposed at a downstream side of the first supply port, the process comprising:
   a step of supplying the powdery material into the kneader from the first supply port and delivering the powdery material to a second supply port side by the kneader at a temperature at which the powdery material is not melted;
   a step of melting the powdery material by heating and simultaneously supplying the liquid material from the second supply port under a pressure higher than a pressure in the kneader to knead a melted product of the powdery material and the liquid material; and
   a step of further kneading a kneaded product thereof while cooling.

2. The process for producing a resin composition for an optical semiconductor according to claim 1, wherein the liquid material is a curing agent and the powdery material is an epoxy resin, a filler, an antioxidant, and a curing accelerator.

3. The process for producing a resin composition for an optical semiconductor according to claim 2, wherein the temperature at which the powdery material is not melted is set within a range of 5 to 50° C., a heating temperature for melting the powdery material is set within a range of 100 to 170° C., and a temperature for cooling the kneaded product is set within a range of 20 to 85° C.

* * * * *